(12) United States Patent
Ehrenpfordt et al.

(10) Patent No.: US 8,981,513 B2
(45) Date of Patent: Mar. 17, 2015

(54) ELECTRICAL CIRCUIT AND METHOD FOR PRODUCING AN ELECTRICAL CIRCUIT

(71) Applicant: Robert Bosch GmbH, Stuttgart (DE)

(72) Inventors: Ricardo Ehrenpfordt, Korntal-Muenchingen (DE); Mathias Bruendel, Stuttgart (DE); Daniel Pantel, Ditzingen (DE); Frederik Ante, Stuttgart (DE); Johannes Kenntner, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/140,930

(22) Filed: Dec. 26, 2013

(65) Prior Publication Data
US 2014/0183679 A1 Jul. 3, 2014

(30) Foreign Application Priority Data
Dec. 27, 2012 (DE) .......................... 10 2012 224 432

(51) Int. Cl.
*H01L 31/0203* (2014.01)
*H01L 25/16* (2006.01)
*B81B 7/00* (2006.01)
*H01L 31/02* (2006.01)
*H01L 31/048* (2014.01)
*H01L 31/0216* (2014.01)

(52) U.S. Cl.
CPC ................ *H01L 25/167* (2013.01); *B81B 7/00* (2013.01); *H01L 25/16* (2013.01); *H01L 31/02008* (2013.01); *H01L 31/048* (2013.01); *H01L 31/02167* (2013.01); *Y02E 10/50* (2013.01); *H01L 2224/16225* (2013.01); *H01L 2224/48091* (2013.01)
USPC ............ 257/433; 257/432; 257/440; 438/57; 438/62; 438/66; 438/96

(58) Field of Classification Search
None
See application file for complete search history.

(56) References Cited

U.S. PATENT DOCUMENTS

2005/0225686 A1* 10/2005 Brummack et al. ............. 349/1
2011/0169554 A1 7/2011 Keysar et al.

* cited by examiner

*Primary Examiner* — Kyoung Lee
(74) *Attorney, Agent, or Firm* — Maginot, Moore & Beck LLP

(57) ABSTRACT

An electrical circuit includes a solar cell that has a photovoltaically active front side and a back side. An electronic or micromechanical component is arranged on the back side of the solar cell and is electrically connected to the photovoltaically active front side of the solar cell by a contact-making structure. The electrical circuit also includes a transparent first protective layer that is arranged on the photovoltaically active front side of the solar cell. The contact-making structure has a first contact-making section that is arranged on a front side of the first protective layer facing away from the solar cell.

15 Claims, 2 Drawing Sheets

ELECTRICAL CIRCUIT AND METHOD FOR PRODUCING AN ELECTRICAL CIRCUIT

This application claims priority under 35 U.S.C. §119 to patent application no. DE 10 2012 224 432.8 filed on Dec. 27, 2012 in Germany, the disclosure of which is incorporated herein by reference in its entirety.

BACKGROUND

The present disclosure relates to an electrical circuit and to a method for producing an electrical circuit.

The integration of energy converters is a trend in the field of electronic packagings. Solar cells especially are used alongside thermoelectric converters for obtaining electrical energy, e.g. for operating sensor modules.

In principle, two ways of making contact with solar cells are possible. With regard to most cells produced at the present time, contact has to be made with them from the front side and the back side, in order to establish an electrical contact (recognizable from the silver conductor structures on the front side). There are also approaches for making contact purely at the back side; these approaches are still used relatively infrequently at present. In the case of the cells with which contact is made on both sides, protecting the front side of the solar cell is furthermore accorded particular importance since the metallizations used can corrode under the influence of moisture. This is realized by lamination between plastic plates in the normal module production process for large-area solar applications.

US 2011/0169554A1 describes an integrated solar-operated component.

SUMMARY

Against this background, the present disclosure provides an electrical circuit and a method for producing an electrical circuit. Advantageous configurations are evident from the respective dependent claims and the following description.

By virtue of the fact that a transparent first protective layer is arranged on the photovoltaically active front side of the solar cell and the contact-making structure has a first contact-making section, which is arranged on a front side of the first protective layer facing away from the solar cell, electrical contact can be made with the solar cell on the front side in a very simple manner using known methods in the art of mounting and connection technology and in this case the solar cell can simultaneously be protected against environmental influences, e.g. moisture, but also mechanical damage. It is thereby possible to realize a very compact circuit having its own energy supply via the solar cell. Furthermore, the circuit according to the disclosure is distinguished by a high cost-effectiveness.

A corresponding electrical circuit comprises the following features:
a solar cell having a photovoltaically active front side and a back side;
an electronic or micromechanical component, which is arranged on the back side of the solar cell and is electrically connected to the photovoltaically active front side of the solar cell by means of a contact-making structure; and
a transparent first protective layer, which is arranged on the photovoltaically active front side of the solar cell;
wherein the contact-making structure has a first contact-making section, which is arranged on a front side of the first protective layer facing away from the solar cell.

A method for producing a corresponding electrical circuit comprises the following steps:
providing a solar cell having a photovoltaically active front side and a back side;
arranging an electronic or micromechanical component on the back side of the solar cell; and
arranging a transparent first protective layer on the front side of the solar cell and a metal layer on a front side of the first protective layer facing away from the solar cell, or a composite layer comprising the first protective layer and the metal layer on the front side of the solar cell; and
providing a contact-making structure, which electrically connects the electronic or micromechanical component to the photovoltaically active front side of the solar cell;
wherein providing the contact-making structure comprises providing a first contact-making section of the contact-making structure on a front side of the first protective layer facing away from the solar cell.

The electrical circuit can be a sensor or an arbitrary electronic component. Accordingly, the electrical or micromechanical component can be, for example, an integrated circuit, a sensor element or a measurement pickup. An integrated circuit can be, for example, an evaluation circuit for processing a sensor signal, a control circuit for controlling a function of the circuit, or a communication device for data transmission. A sensor element can be, for example, a temperature sensor, a force pickup or an acceleration sensor. The electronic or micromechanical component can furthermore be embodied as an application-specific integrated circuit, or as a microsystem. Even complex functions can be realized by means of an application-specific integrated circuit, also called ASIC. The microsystem can be a so-called MEMS (microelectromechanical system). A respectively suitable component can be selected depending on the field of application. Moreover, components of different types can be combined and can be arranged alongside one another or else in a manner stacked one above another on the back side of the solar cell or at the contact-making structure on the back side of the solar cell. The component can be a discrete, fully functional element which is applied as a finished component to the back side of the solar cell.

The electrical circuit can also comprise a store for electrical energy. By way of example, the store can be arranged on the back side of the solar cell. In this case, the store can be electrically and mechanically connected to the solar cell or the contact-making structure by means of a connection produced by the art of mounting and connection technology. Furthermore, the store can be connected between an electrical terminal contact of the solar cell and an electrical terminal contact of the electronic or micromechanical component. The store can be, for example, a galvanic element, for example a rechargeable battery or a capacitor. By means of the store, electrical energy can be provided to the component even when the solar cell provides no energy or does not provide enough energy for the operation of the component.

In order to develop compact, autonomous sensors it is necessary to provide the energy necessary for operation by conversion from other forms of energy. This is made possible by the cost-effective and small-design integration of photovoltaic cells into autonomous sensor modules. The solar cell can be a photovoltaic cell designed to convert radiation energy, for example sunlight, into electrical energy. The solar cell can be embodied in the form of a planar, thin wafer.

Owing to the optical properties of the solar cell used, a precise selection of materials is necessary in the case of the protective layer or the protective layers. Especially in the absorption range, the materials used, which are preferably polymers, must have a high transparency (typical wavelengths are 400 to 900 nm).

The first contact-making section of the contact-making structure can be embodied as a structured redistribution wiring plane having at least one metal layer in order to provide an energy provided by the solar cell to the electronic or micromechanical component directly or via an interposed energy store. For this purpose, the first contact-making section or the redistribution wiring plane can have suitable electrical conductor tracks and contact areas. The first contact-making section of the contact-making structure can be produced by a manufacturing method in which the conductor track or structured redistribution wiring plane is produced directly on the back side of the solar cell. In particular, laminating and structuring methods similar to those from printed circuit board production processes can be used. However, it is also conceivable for the first contact-making section to be manufactured separately and subsequently to be placed onto the first protective layer, for example in the form of an adhesively bonded conductor track or redistribution wiring layer or an adhesively bonded layer composite.

Mounting and connection technology, as an area of microelectronics and microsystems engineering, encompasses the totality of the technologies and design tools which are required for mounting microelectronic components. The connection techniques include, for example, wire bonding techniques, TAB (Tape Automated Bonding), flip-chip technology, adhesive bond, anodic bonding, soldering techniques, reflow soldering methods (SMT Surface Mounting Technology), and wave soldering methods. The mounting techniques include, for example, layer technologies, thin-film techniques, layer modifications, layer structuring, layer removal, laser processes and singulation.

It is advantageous if the first protective layer covers the photovoltaically active front side of the solar cell approximately over the whole area. The term "approximately" means that the entire photovoltaically active front side of the solar cell apart from the connection or contact-making point of the contact-making structure with respect to the front side of the solar cell is covered by the first protective layer. This provides very good protection of the entire solar cell against environmental influences and mechanical effects.

Furthermore, it is advantageous if the first protective layer is embodied as a polymer layer applied by means of lamination, screen printing, curtain casting or spin coating. By means of these methods, the first protective layer, which is preferably formed from a polymer, can be applied to the front side of the solar cell in a cost-effective manner.

Furthermore, it is advantageous if an encapsulation compound is provided, which covers the electronic or micromechanical component and extends over a lateral edge of the solar cell, and if the first protective layer extends over a front side of the encapsulation compound. The encapsulation compound is arranged on the back side of the redistribution wiring plane and encloses the component. A housing for the component and for the electrical circuit is formed by the encapsulation compound, which can be embodied in particular as a molding compound, in a simple manner since the solar cell with the components can be embedded into the encapsulation compound. As a result, firstly, good protection is provided and, if appropriate, a passivation is also provided. Secondly, a structure is also provided laterally with respect to the solar cell, through or on which structure the contact-making structure can be securely led laterally with respect to the solar cell in order to make contact with the front side of the solar cell.

It is advantageous, moreover, if the first contact-making section of the contact-making structure is embodied as a metal layer or redistribution wiring plane that is structured and/or applied by means of lamination. As a result, in a simple manner, a metal layer, which can be a copper or aluminum layer, for example, can be laminated onto the first protective layer, for example over the whole area, and can be structured during a later method step, for example lithographically and by etching, in order to form the first contact-making section. However, it is also conceivable for the first protective layer, which is formed from a thermoplastic, for example, and the metal layer, which is embodied as a copper or aluminum foil, for example, to be introduced into the process already as composite material and to be applied to the front side of the solar cell and, if appropriate, the front side of the encapsulation compound.

Furthermore, it is advantageous if a transparent second protective layer is provided, which is arranged on the front side of the first protective layer and covers the first contact-making section of the contact-making structure. This provides a very good protection of the first contact-making section. The second protective layer, which is preferably embodied as a polymer layer, can be applied to the first contact-making section of the contact-making structure in particular in a further lamination step. However, the second protective layer can also be applied to the first protective layer and the first contact-making structure over the whole area.

Furthermore, it is advantageous if the contact-making structure has a second contact-making section, which extends transversely with respect to a longitudinal direction of the first protective layer through the latter and electrically connects the first contact-making section of the contact-making structure to the photovoltaically active front side of the solar cell. It is also advantageous if the contact-making structure has a third contact-making section, which extends transversely with respect to a longitudinal direction of the first protective layer through the latter as far as the front side of encapsulation compound. The expression "transversely with respect to the longitudinal direction" is taken to mean here that the second or respectively third contact-making section extends in the thickness direction of the first protective layer, but does not necessarily extend perpendicularly to the surface, but rather can be at a specific angle with respect thereto. In this case, the second contact-making section extends from the front side of the first protective layer, i.e. from the first contact-making section, as far as the back side of the first protective layer, i.e. as far as the active front side of the solar cell or a collecting electrode thereof. The third contact-making section extends analogously from the front side of the first protective layer, i.e. from the first contact-making section, as far as the back side of the first protective layer, but as far as the front side of the encapsulation compound laterally with respect to the solar cell, namely as far as a fourth contact-making section of the contact-making structure. This measure makes it possible, in a simple manner, to produce an electrical connection from the first contact-making section, arranged on the front side of the first protective layer, to the rest of the electrical circuit, situated on the back side of the first protective layer facing away from the front side of the first protective layer. In particular, in one manufacturing step, a corresponding opening can be drilled, for example by means of a laser, through the first protective layer and the metal layer arranged thereon and can subsequently be metalized by an electroplating process in order to produce an electrical connection.

Furthermore, it is advantageous if the contact-making structure has a fourth contact-making section, which is arranged on the back side of the solar cell and is electrically and mechanically connected to the solar cell, and if the electronic or micromechanical component is arranged on a back side of the fourth contact-making section facing away from the solar cell and is electrically and mechanically connected to the fourth contact-making section. Advantageously, the fourth contact-making section of the contact-making structure can be embodied as a redistribution wiring plane having at least one structured metal layer. The redistribution wiring plane can be embodied partly as a layer situated between the solar cell and the component. A thickness of the redistribution wiring plane can be thinner than a thickness of the component or a thickness of the solar cell. The redistribution wiring plane is in this case designed to produce a mechanical connection between the component and the solar cell. Furthermore, the redistribution wiring plane is designed to provide an energy provided by the solar cell to the component directly or via an interposed energy store. For this purpose, the redistribution wiring plane can have suitable electrical conductor tracks and contact areas. It is also possible for a plurality of electronic or micromechanical components to be arranged on the back side of the redistribution wiring plane. The component can be a discrete element which can be produced independently of the solar cell and can be connected as a finished element to the redistribution wiring plane via the connection. Using mounting and connection technology, the component can be connected to the redistribution wiring plane by means of known methods. The art of mounting and connection technology can encompass a cohesive joining method. Consequently, the component can be connected to the redistribution wiring plane via a cohesive joining connection. By way of example, the connection can run between an electrical contact area of the component and an electrical contact area of the redistribution wiring plane. By way of example, the connection can be produced by means of soldering, adhesive bonding or wire bonding, or a combination of these methods. Corresponding materials that form the connection may have been arranged on the component or on the redistribution wiring plane beforehand. The connection can be produced by known methods rapidly, cost-effectively and in a space-saving manner.

In contrast to a redistribution wiring layer that is produced separately and subsequently placed onto the solar cell, for example in the form of an adhesively bonded printed circuit board or an adhesively bonded circuit carrier, the redistribution wiring layer can also be produced by a production method in which the redistribution wiring layer is produced directly on the back side of the solar cell. The solar cell can thus be used as a substrate for mounting the redistribution wiring layer. In this case, the redistribution wiring plane can be built up layer by layer by forming individual layers on the back side of the solar cell. The redistribution wiring plane can thus be produced without a separately produced layer composite being applied to the back side of the solar cell. Traditional semiconductor production methods can be used for producing the redistribution wiring plane on the back side of the solar cell. By providing the fourth contact-making section as a redistribution wiring plane on the back side of the solar cell, it is possible to arrange an electronic or a micromechanical component on the back side of the solar cell using known methods in the art of mounting and connection technology, as a result of which a very compact circuit with its own energy supply via the solar cell are realized.

Furthermore, it is advantageous if the contact-making structure has a fifth contact-making section, which extends in and/on an outer surface of the encapsulation compound and electrically connects the third contact-making section of the contact-making structure to the fourth contact-making sections of the contact-making structure. Advantageously, the fifth contact-making section of the contact-making structure comprises a wire bond or a first plated-through hole, a second plated-through hole and an electrical conductor track electrically connecting the two plated-through holes. In the latter case, the electrical contact-making between the third contact-making section and the fourth contact-making section can be realized only after the encapsulation compound has been applied. This measure makes it possible to provide, in a simple and secure manner, contact-making of the third contact-making section—protruding from the first protective layer—of the contact-making structure and the fourth contact-making section—arranged on the back side of the solar cell—of the contact-making structure.

BRIEF DESCRIPTION OF THE DRAWINGS

The disclosure is explained in greater detail by way of example below with reference to the accompanying drawings, in which.

DETAILED DESCRIPTION

Figure 1:
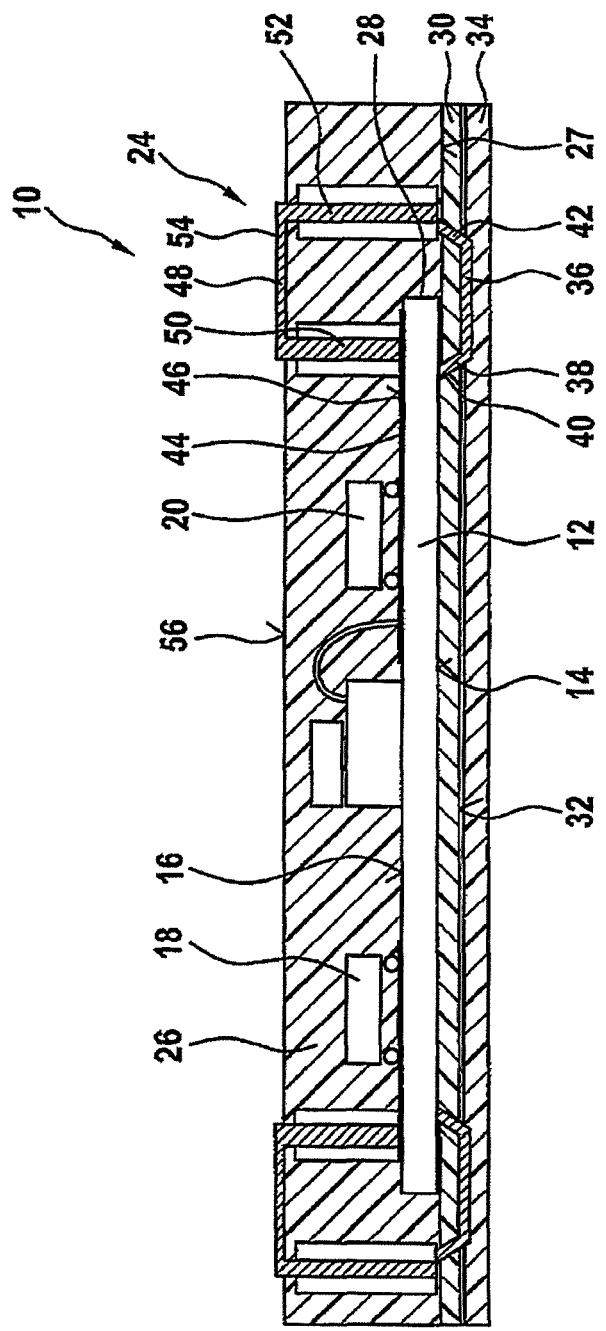
FIG. 1 shows a schematic illustration of a circuit in accordance with one exemplary embodiment of the present disclosure.

FIG. 1 shows a schematic illustration of an electrical circuit 10 in accordance with one exemplary embodiment of the present disclosure. The circuit 10 comprises a solar cell 12, also called photovoltaic cell, having a photovoltaically active front side 14 and a back side 16. The solar cell 12 can be constructed from semiconductor materials in a manner corresponding to known solar cells. The solar cell 12 can have a suitable layer construction. The front side 14 of the solar cell 12 has a planar surface, which can be rectangular, for example. The solar cell 12 is designed to convert radiation incident on the active front side 14 into electrical energy and to provide said electrical energy at terminals of the solar cell 12. At least one front-side terminal of the solar cell 12 is arranged on the front side 14 of the solar cell 12 and at least one back-side terminal of the solar cell 12 is arranged on the back side 16 of the solar cell 12.

The circuit 10 furthermore comprises two components 18, 20 arranged at the back side 16 of the solar cell 12. The components 18, 20 are designed as electronic or micromechanical components 18, 20. The components 18, 20 are electrically and mechanically connected to the solar cell 12 in each case via a part of the contact-making structure 24. During the operation of the solar cell 12, an electrical voltage is present between the front-side terminal and the back-side terminal, which voltage can be used for operating the components 18, 20.

Furthermore, the circuit 10 comprises an encapsulation compound 26. The encapsulation compound 26 encapsulates the components 18, 20 and also the back side 16 of the solar cell 12 or the regions of the contact-making structure 24 that are arranged on the back side 16 of the solar cell 12. A thickness of the layer of the encapsulation compound 26 can be chosen such that the components 18, 20 are completely enclosed by the encapsulation compound 26. Depending on the embodiment, the encapsulation compound 26 can be embodied for example as a potting compound or a molding compound. Furthermore, the encapsulation compound 26 is led beyond a lateral edge 28 of the solar cell 12 and thereby forms a front side 27 of the encapsulation compound 26. As a result, the solar cell 12, apart from the active front side 14 of the solar cell 12, is embedded into the encapsulation compound 26.

The circuit 10 can be a solar cell 12 which is equipped with electronic components 18, 20 on the back side, is mechanically and electrically contact-connected by flip-chip technology and is encapsulated with the encapsulation compound 26.

According to the disclosure, a transparent first protective layer 30 is arranged on the photovoltaically active front side 14 of the solar cell 12. In this case, the first protective layer 30 extends over the entire front side 14 of the solar cell 12 and the front side 27 of the encapsulation compound 26. In this case, the first protective layer 30 covers the front side 14 of the solar cell 12—apart from the contact-making points between the contact-making structure 24 and the front side 14 or the collecting electrode of the solar cell 12—over the whole area. In this case, the first protective layer 30 can be designed as a polymer layer. Furthermore, the first protective layer 30 can be applied by means of laminating, screen printing, curtain casting or spin coating.

Furthermore, a second protective layer 34 is provided on a front side 32 of the first protective layer 30 facing away from the front side 14 of the solar cell 12. The second protective layer 34 extends over the entire front side 32 of the first protective layer 30 and covers the latter and a part of the contact-making structure 24. The second protective layer provides, in particular, protection of the exposed part of the contact-making structure, as explained in greater detail below. The second protective layer 34 can likewise be designed as a polymer layer and applied by means of laminating, screen printing, curtain casting or spin coating.

Since the two components 18, 20 are electrically connected to the front side 14 of the solar cell 12 in each case by means of analogously designed contact-making structures 24, reference is made below only to one of the two contact-making structures 24.

Accordingly, the contact-making structure 24, which electrically connects the component 18, 20 to the front side 14 of the solar cell 12, has a first contact-making section 36. The first contact-making section 36 is arranged on the front side 32 of the first protective layer 30. In accordance with the exemplary embodiment shown, the first contact-making section 36 of the contact-making structure 24 is furthermore covered by the second protective layer 34, as a result of which it is protected against environmental influences. Consequently, the first contact-making section 36 is arranged between the first protective layer 30 and the second protective layer 34. In this case, the first contact-making section 36 can be designed as a redistribution wiring plane having at least one metal layer. For this purpose, a structured or non-structured metal layer can be applied to the first protective layer 30 by means of a suitable method. If a non-structured metal layer is applied, then it can subsequently be structured in order to shape conductor tracks. In order to form a multilayered redistribution wiring plane, two or more metal layers can be applied successively. By way of example, the first contact-making section 36 can be applied by lamination and can subsequently be structured. As already explained in the introduction, however, it is also conceivable for the first protective layer 30 and the metal layer already to be applied as composite material jointly to the front side 14 of the solar cell 12 and then for the metal layer to be structured.

Furthermore, the contact-making structure 24 has a second contact-making section 38. The second contact-making section 38 extends transversely with respect to a longitudinal direction of the first protective layer 30 through the latter and provides an electrical connection of the first contact-making section 36 of the contact-making structure 24 to the photovoltaically active front side 14, in particular a collecting electrode arranged thereon, of the solar cell 12. In this case, a corresponding opening 40 can be drilled, for example by means of a laser, through the first protective layer 30 and the metal layer arranged thereon and can subsequently be metalized by an electroplating process in order to produce the electrical connection, i.e. the second contact-making section 38.

Furthermore, the contact-making structure 24 has a third contact-making section 42. The third contact-making section 42 likewise extends transversely with respect to a longitudinal direction of the first protective layer 30 through the latter as far as the front side 27 of the encapsulation compound 26. The third contact-making section 42 extends analogously from the front side of the first protective layer 30, i.e. from the first contact-making section 36, as far as the back side of the first protective layer 30, although as far as the front side 27 of the encapsulation compound 26 laterally with respect to the solar cell 12. In this case, the production of the third contact-making section 42 can be carried out analogously to that of the second contact-making section 38. As described above, the expression "transversely with respect to the longitudinal direction" is taken to mean that the second or respectively third contact-making section extends in the thickness direction of the first protective layer, but does not necessarily extend perpendicularly to the surface, but rather can be at a specific angle with respect thereto.

The contact-making structure 24 additionally has a fourth contact-making section 44. The fourth contact-making section 44 can be designed as a redistribution wiring plane having at least one metal layer. The fourth contact-making section 44 or the redistribution wiring plane extends over the back side 16 of the solar cell 12 arranged opposite the front side 14 of the solar cell. The redistribution wiring plane is mechanically fixedly connected to the back side 16 of the solar cell 12. The components 18, 20 are arranged at a back side 46 of the fourth contact-making section 44 or the redistribution wiring plane and are mechanically fixedly connected thereto. The redistribution wiring plane is designed to provide an electrical energy required for the operation of the components 18, 20 from the terminals of the solar cell 12 to contacts of the components 18, 20. Furthermore, the redistribution wiring plane is designed to conduct electrical signals depending on the embodiment of the circuit 10 and of the components 18, 20 between contacts of the components 18, 20 or between contacts of the components 18, 20 and external contacts of the circuit 10. For this purpose, the redistribution wiring plane, that is to say the fourth contact-making section 44 of the contact-making structure 24, can have a plurality of conductor tracks. The redistribution wiring plane can have one or a plurality of layers. If the redistribution wiring plane has a plurality of layers, then conductor tracks can be realized in a transposed fashion. The redistribution wiring plane can be embodied as a back-side metalization of the solar cell 12. For this purpose, by means of a suitable method, a structured or non-structured metal layer can be applied to the back side 16 of the solar cell 12. If a non-structured metal layer is applied, then it can subsequently be structured in order to shape the redistribution wiring plane. In order to form a multilayered redistribution wiring plane, two or more metal layers can be applied successively.

The components 18, 20 can be "bare dies", packaged sensors, e.g. molded packages, or sensor modules. The electrical contact-making between the components 18, 20 and the fourth contact-making section 44—embodied as back-side metallization—can be effected by flip-chip technology.

The contact-making structure 24 furthermore has a fifth contact-making section 48. The fifth contact-making section 48 comprises a first plated-through hole 50, a second plated-through hole 52 and an electrical conductor track 54 that electrically connects the two plated-through holes 50, 52. The first plated-through hole 50 is led from the fourth contact-making section 44 or the redistribution wiring plane to an outer surface 56 of the encapsulation compound 26 facing the redistribution wiring plane. The electrical conductor track 54 extends on the outer surface 56 of the encapsulation compound 26 between the first plated-through hole 50 and the second plated-through hole 52. The second plated-through hole 52 extends through the complete thickness of the encapsulation compound 26 in a region extending beyond the lateral edge 28 of the solar cell 12. The encapsulation compound 26 can be embodied as a molding compound, for example. In this case, the plated-through holes 50, 52 can be embodied as molded through-contacts.

In this configuration, the fifth contact-making section 48, i.e. the electrical connection between the third contact-making section 42 and the fourth contact-making section 44, can be realized only after the encapsulation compound 26 has been applied. This is relevant especially when a substrateless process is used for producing the encapsulation 26, e.g. on the basis of eWLB technology (Embedded Wafer Level Ball Grid Array Technology). One specific embodiment is a "package-on-package" design, in which the outer surface 56 of the encapsulation compound 26 can be used as a redistribution wiring plane for mounting further bare dies or packaged components (not illustrated).

Furthermore, contact-making in the encapsulation compound 26 is also conceivable traditionally as wire bonding technology. In this case, the fifth contact-making section 48 is designed as a wire bond.

Figure 2:
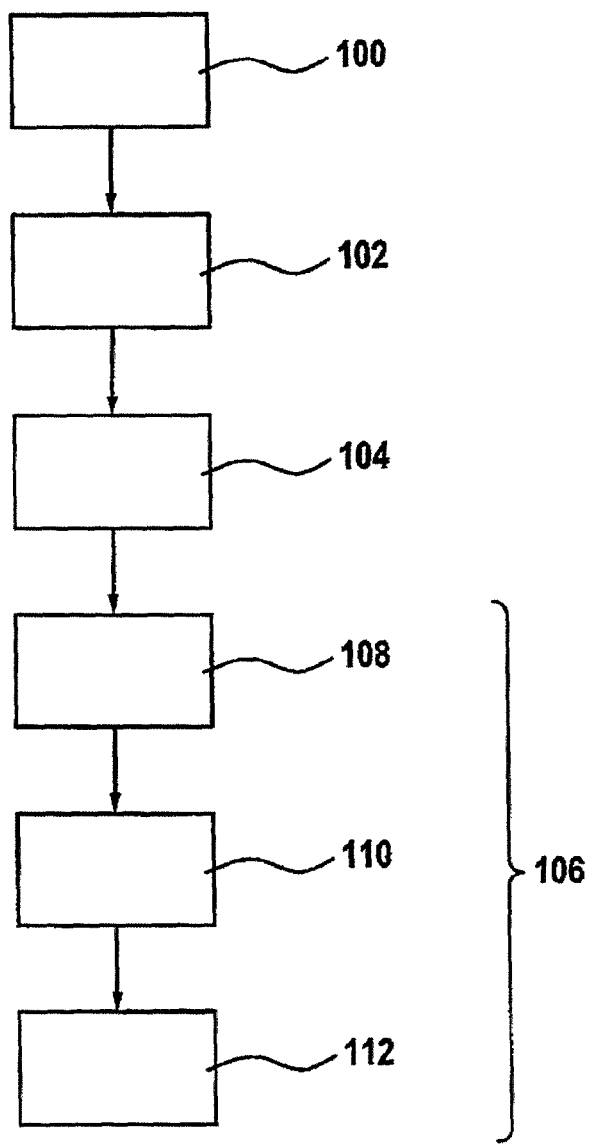
FIG. 2 shows a flow chart of a method for producing an electrical circuit in accordance with one exemplary embodiment of the present disclosure.

FIG. 2 shows a flow chart of a method for producing an electrical circuit 10 in accordance with one exemplary embodiment of the present disclosure. The circuit 10 can be a circuit 10 as shown in the previous figures.

A step 100 involves providing a solar cell 12 having a photovoltaically active front side 14 and a back side 16 arranged opposite the front side 14.

A step 102 involves arranging an electronic or micromechanical component 18, 20 on the back side 16 of the solar cell 20. At the same time or in a step performed subsequently, the component 18, 20 can be electrically and mechanically connected to the solar cell 12, for example by means of a contact-making structure, for example a redistribution wiring plane. Mounting and connection technology can be used in this case. By way of example, the at least one component 18, 20 can be provided as a discrete component and can be arranged on the redistribution wiring plane and can subsequently be fixed to the redistribution wiring plane by means of a soldering process or an adhesive-bonding process, for example.

A step 104 involves arranging a transparent first protective layer 30 on the front side 14 of the solar cell 12 and a metal layer on a front side 32 of the first protective layer 30 facing away from the solar cell 12. Alternatively, a composite layer comprising the first protective layer 30 and the metal layer can also be arranged on the front side 14 of the solar cell 12. In particular, laminating and structuring methods similar to those from printed circuit board production processes can be used for this purpose.

A step 106 involves providing a contact-making structure 24, which electrically connects the electronic or micromechanical component 18, 20 to the photovoltaically active front side 14 of the solar cell 12. Step 106 comprises a step 108 that involves providing an opening 40 extending transversely with respect to a longitudinal direction of the first protective layer 30 and the metal layer. Furthermore, step 106 comprises a step 110 that involves providing a second contact-making section 38 of the contact-making structure 24 in the opening 40, said second contact-making section electrically connecting the first contact-making section 36 of the contact-making structure 24 to the photovoltaically active front side 14 of the solar cell 12. This can be effected by means of an electroplating process, for example. Furthermore, step 106 comprises step 112 that involves structuring the metal layer in order to form a first contact-making section 36 of the contact-making structure on a front side 32 of the first protective layer 30 facing away from the solar cell 12.

An application of the design described is possible for energy-autonomous sensors, for example. The exemplary embodiment described and shown in the figure has been chosen merely by way of example. Furthermore, method steps according to the disclosure can be performed repeatedly and in a different order than that described. If an exemplary embodiment comprises an "and/or" combination between a first feature and a second feature, then this should be interpreted such that the exemplary embodiment has both the first feature and the second feature in accordance with one embodiment and has either only the first feature or only the second feature in accordance with a further embodiment.

What is claimed is:

1. An electrical circuit, comprising:
   a solar cell having a photovoltaically active front side and a back side;
   an electronic or micromechanical component arranged on the back side of the solar cell and electrically connected to the photovoltaically active front side of the solar cell by a contact-making structure; and
   a transparent first protective layer arranged on the photovoltaically active front side of the solar cell,
   wherein the contact-making structure has a first contact-making section arranged on a front side of the first protective layer facing away from the solar cell.

2. The electrical circuit according to claim 1, wherein the first protective layer covers the photovoltaically active front side of the solar cell approximately over the whole area.

3. The electrical circuit according to claim 1, wherein the first protective layer is configured as a polymer layer applied by one or more of lamination, screen printing, curtain casting, spray-coating, or spin coating.

4. The electrical circuit according to claim 1, further comprising an encapsulation compound that covers the electronic or micromechanical component and extends over a lateral edge of the solar cell, the first protective layer extending at least partly over a front side of the encapsulation compound.

5. The electrical circuit according to claim 1, wherein the first contact-making section of the contact-making structure is configured as a metal layer that is structured and/or applied by lamination.

6. The electrical circuit according to claim 1, further comprising a transparent second protective layer arranged on the front side of the first protective layer, the second protective layer covering the first contact-making section of the contact-making structure.

7. The electrical circuit according to claim 1, wherein the contact-making structure has a second contact-making section that extends transversely with respect to a longitudinal direction of the first protective layer through the latter and electrically connects the first contact-making section of the contact-making structure to the photovoltaically active front side of the solar cell.

8. The electrical circuit according to claim 4, wherein the contact-making structure has a third contact-making section that extends transversely with respect to a longitudinal direction of the first protective layer through the latter as far as the front side of the encapsulation compound.

9. The electrical circuit according to claim 7, wherein:
the contact-making structure has a third contact-making section that extends transversely with respect to a longitudinal direction of the first protective layer through the latter as far as the front side of the encapsulation compound; and
one or more of the second contact-making section and the third contact-making section of the contact-making structure is configured as a metal contact introduced by electroplating.

10. The electrical circuit according to claim 1, wherein the contact-making structure has a fourth contact-making section that is arranged on the back side of the solar cell and is electrically and mechanically connected to the solar cell, and wherein the electronic or micromechanical component is arranged on a back side of the fourth contact-making section facing away from the solar cell and is electrically and mechanically connected to the fourth contact-making section.

11. The electrical circuit according to claim 10, wherein the fourth contact-making section of the contact-making structure is configured as a redistribution wiring plane having at least one structured metal layer.

12. The electrical circuit according to claim 4, wherein:
the contact-making structure has a third contact-making section that extends transversely with respect to a longitudinal direction of the first protective layer through the latter as far as the front side of the encapsulation compound;
the contact-making structure has a fourth contact-making section that is arranged on the back side of the solar cell and is electrically and mechanically connected to the solar cell;
the electronic or micromechanical component is arranged on a back side of the fourth contact-making section facing away from the solar cell and is electrically and mechanically connected to the fourth contact-making section; and
the contact-making structure has a fifth contact-making section that extends one or more of in the encapsulation compound and on an outer surface of the encapsulation compound and electrically connects the third contact-making section of the contact-making structure to the fourth contact-making sections of the contact-making structure.

13. The electrical circuit according to claim 12, wherein the fifth contact-making section of the contact-making structure comprises a wire bond or a first plated-through hole, a second plated-through hole, and an electrical conductor track electrically connecting the two plated-through holes.

14. A method for producing an electrical circuit, comprising:
arranging an electronic or micromechanical component on a solar cell having a photovoltaically active front side and a back side, the electronic or micromechanical component being arranged on the back side of the solar cell;
arranging a transparent first protective layer on the front side of the solar cell and a metal layer on a front side of the first protective layer facing away from the solar cell, or arranging a composite layer comprising the first protective layer and the metal layer on the front side of the solar cell; and
electrically connecting the electronic or micromechanical component to the photovoltaically active front side of the solar cell via a contact-making structure,
wherein the contact-making structure includes a first contact-making section arranged on a front side of the first protective layer facing away from the solar cell.

15. The method according to claim 14, wherein electrically connecting the electronic or micromechanical component to the photovoltaically active front side of the solar cell includes:
defining an opening extending transversely with respect to a longitudinal direction of the first protective layer and the metal layer;
electrically connecting the first contact-making section of the contact-making structure to the photovoltaically active front side of the solar cell via a second contact-making section of the contact-making structure, the second contact-making section being arranged in the opening; and
structuring the metal layer so as to form the first contact-making section of the contact-making structure.

* * * * *